United States Patent [19]
Li et al.

[11] Patent Number: 5,998,738
[45] Date of Patent: Dec. 7, 1999

[54] ELECTRONIC CONTROL MODULE

[75] Inventors: Ronald Li, Lake Zurich; Amy McKernan, Green Oaks, both of Ill.

[73] Assignee: Motorola Inc., Schaumburg, Ill.

[21] Appl. No.: 08/706,014

[22] Filed: Aug. 30, 1996

[51] Int. Cl.⁶ ...................................................... H05K 1/00
[52] U.S. Cl. ............................................ 174/250; 361/793
[58] Field of Search ..................................... 174/250, 259, 174/254, 255, 268; 361/749, 750, 792, 793, 794, 795, 752, 753; 439/67, 77

[56] References Cited

U.S. PATENT DOCUMENTS

| | | | |
|---|---|---|---|
| 4,626,462 | 12/1986 | Kober et al. ............................. | 428/137 |
| 4,811,165 | 3/1989 | Currier et al. . | |
| 5,103,375 | 4/1992 | Cottingham et al. .................... | 361/175 |
| 5,159,751 | 11/1992 | Cottingham et al. . | |
| 5,170,326 | 12/1992 | Meny et al. . | |
| 5,179,501 | 1/1993 | Ocken et al. ............................ | 361/709 |
| 5,216,581 | 6/1993 | Fisher et al. ............................. | 361/728 |
| 5,265,322 | 11/1993 | Fisher et al. . | |

*Primary Examiner*—Bot L. Ledynh
*Assistant Examiner*—Dhiru R Patel
*Attorney, Agent, or Firm*—Jasper W. Dockrey

[57] ABSTRACT

An electronic control module (40) includes a base plate (12) bent about first and second major bend axis (27, 28). The base plate includes first and second grooves (29, 30) formed at an upper surface (15a) coextensive with the first and second major bend axis (27, 28). A flexible film (18) is asymmetrically bonded by adhesive films (31, 32) about the first and second major bend axis (27, 28). The asymmetrical bonding of the flexible film (18) about the major bend axis (27, 28) causes non-bonded loop portions (35) of the flexible film (18) to assume a serpentine pattern and deflect away from the major bend axis (27, 28) when the base plate (12) is bent about the major bend axis (27, 28). The bonding arrangement of the flexible film (18) to the base plate (12) permits an electrical connector (36) to be attached to the backside of the electronic control module (40).

12 Claims, 4 Drawing Sheets

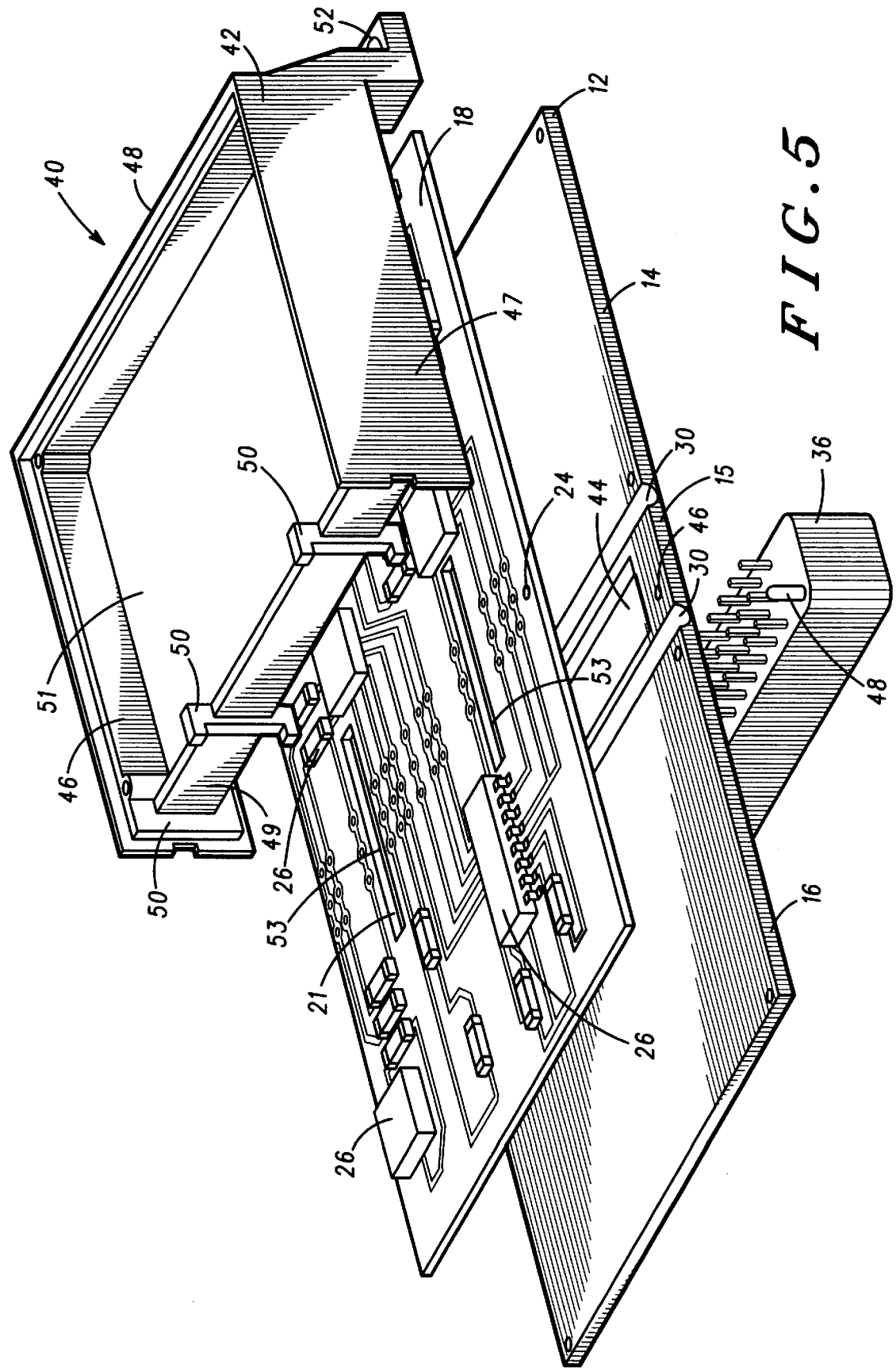

ELECTRONIC CONTROL MODULE

FIELD OF THE INVENTION

This invention relates, in general, to electronic module assemblies, and more particularly, to electronic control modules having an external housing for protecting electrical components located within the module housing.

BACKGROUND OF THE INVENTION

The protection of electronic components within a modular assembly is commonly carried out by attaching a flexible polyimide film to a relatively thin metal plate. A plurality of electronic components are mounted on the polyimide film and connected to conductive circuit patterns overlying the polyimide film. Once the electronic components are mounted, the metal plate is bent about a mandrel and mated with an endosure device to form a protective enclosure for the electronic devices. In one such electronic module assembly, disclosed in U.S. Pat. No. 5,170,326 to Meny, et al. and assigned to the assignee of record herein, a module enclosure meets with the base plate to form an internal cavity enclosing circuit components mounted to the polyimide flex film.

A substantial improvement in the quality and protection characteristics of electronic module assemblies has been realized by the mating of a bendable base plate with an enclosure device. The enclosure device functions to strengthen the overall structure of the completed assembly. Furthermore, the enclosure device acts as a mandrel about which the base plate can be bent. The enclosure device is not removed after the bending operation and becomes an integral portion of the overall structure. This eliminates any possibility of damage to the components on the flex film that could result during a removal of the mandrel.

In addition to providing an integral component of the overall structure, the enclosure device also provides a surface for sealing the base plate. The sealant material can be applied to the base plate prior to the bending operation to improve the manufacturability of the electronic control module. In view of the foregoing advantages realized by coupling a closure device with a bendable base plate, further development is desirable to obtain maximum utilization of the protective enclosure and to reduce the overall size of an engine control module.

BRIEF DESCRIPTION OF THE DRAWINGS

FIG. 5 is an exploded perspective view of an electronic control module constructed in accordance with the invention, where some of the components being shown in a planar form prior to being bent into their final shape;

Figure 1:
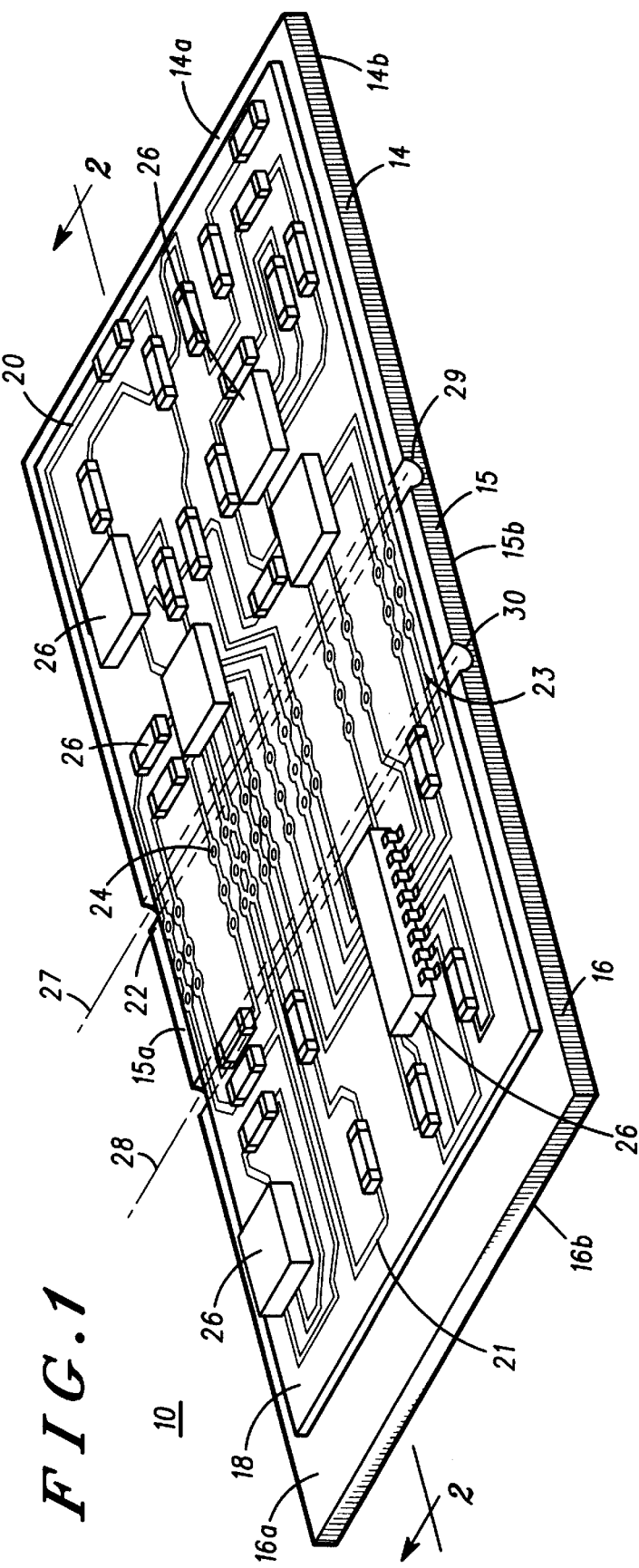
FIG. 1 is a perspective view of a planar electronic subassembly in accordance with the invention.

It will be appreciated that for simplicity and clarity of illustration, elements shown in the FIGURES have not necessarily been drawn to scale. For example, the dimensions of some of the elements are exaggerated relative to each other. Further, where considered appropriate, reference numerals have been repeated among the FIGURES to indicate corresponding elements.

DETAILED DESCRIPTION OF PREFERRED EMBODIMENTS

The present invention is for an electronic module assembly in which a flexible circuit bearing film is mounted on a metal base plate. The flexible film is bonded to the base plate, such that when the base plate is bent along a major bend axis, a non-bonded portion of the flexible film shifts away from the bend axis along an interior surface of the base plate. The shifting action of the flexible film reduces stress in the film associated with the bending action of the base plate. The bonding arrangement also insures that the flexible film will not become trapped against the base plate during the bending operation. Additionally, the base plate is machined in such a way as to provide substantially a 90° angle at the major bend axis on the outside edge of the base plate. The combination of the substantial 90° angle together with the shifting of the flexible film permits the flexible film to be populated with electrical components, many of which can be placed in dose proximity to the major bend axis. These and other advantages of the invention will be appreciated upon a description of the preferred embodiments of the invention.

FIG. 1 illustrates a perspective view of a planar flex circuit subassembly arranged in accordance with one embodiment of the invention. The subassembly 10 includes a base plate 12 having integral first, second, and third sections 14, 15, and 16, respectively. Each section includes top surfaces 14a, 15a, and 16a, and bottom surfaces 14b, 15b, and 16b. A flexible film 18 overlies base plate 12 and is bonded to top surfaces 14a, 15a, and 16a of base plate 12. Preferably, flexible film 18 is a polyimide material having a thickness of about 0.5 mm. Flexible film 18 supports electrically conductive metal traces 20 and 21 overlying portions of top surfaces 14a and 16a, respectively. Metal traces 20 include terminations 22 at through holes 24 in second section 15 of base plate 12. Similarly, metal traces 21 include terminations 23 at through holes 24. As will subsequently be described, through holes 24 pierce flexible film 18 and second section 15 of base plate 12, and are configured to receive electrical contact pins housed within an electrical connector. A plurality of electrical devices 26 are attached to flexible film 18 and electrically interconnected by metal traces 20 and 21.

In the process for assembling an electronic control module, it is desirable to bend base plate 12 in such a way that the base plate can be coupled with an enclosure device to form a protective enclosure encasing metal traces 20 and 21 and electrical devices 26. To facilitate the bending process, base plate 12 includes first and second major bend axis 27 and 28, respectively. Base plate 12 further includes first and second grooves 29 and 30 aligned to major bend axis 27 and 28, respectively. First and second grooves 29 and 30 extend across base plate 12 at upper surface 15a of second section 15.

Figure 2:
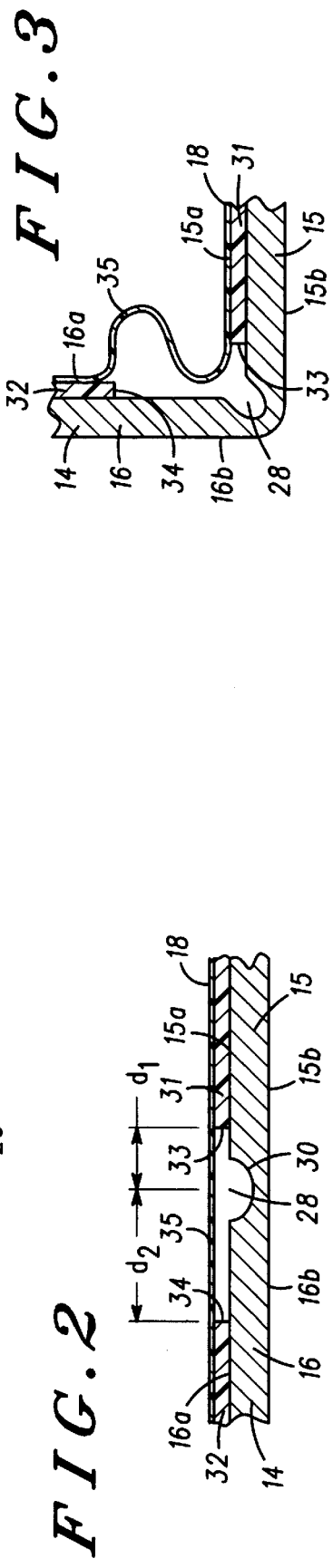
FIG. 2 is a cross-sectional view of a portion of the subassembly of FIG. 1 taken along section line 2—2.

A portion of base plate 12 taken along section line 2—2 is shown in FIG. 2. A portion of flexible film 18 spans second groove 30 and is bonded to upper surfaces 15a and 16a by first and second adhesive films 31 and 32, respectively. First adhesive film 31 has an edge 33 located a distance $d_1$ from major bend axis 28. Correspondingly, second adhesive film 32 has an edge 34 located a distance $d_2$ from major bend axis 28. A non-bonded portion 35 of flexible film 18 spans distances $d_1$ and $d_2$ between edges 33 and 34. By selectively placing first and second adhesive layers 31 and 32 on base plate 12, a gap is created between the adhesive layers that is asymmetrically centered about major bend axis 28. Distance $d_2$ defines the extent of the gap along third section 16 of base plate 12. Correspondingly, distance $d_1$ defines the extent of the gap along second section 15 of base plate 12.

Figure 3:
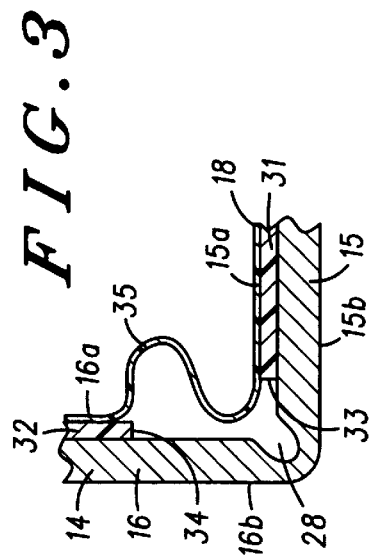
FIG. 3 shows a portion of the subassembly shown in FIG. 2 after a bending operation.

The asymmetrical centering of the gap between first and second adhesive films 31 and 32 result in a lateral shift of non-bonded portion 35 when base plate 12 is bent about major bend axis 28. As shown in FIG. 3, non-bonded portion 35 shifts along third section 16 of base plate 12 in the direction of distance $d_2$ and away from major bend axis 28. By selectively locating first and second adhesive films 31 and 32 on base plate 12, the direction of the deformation profile of non-bonded portion 35 can be controlled at the time base plate 12 is bent about major bend axis 28. The deflection of non-bonded portion 35 along upper surface 16b permits electrical devices 26 to be mounted on flexible film 18 in close proximity to major bend axis 28. Additionally by deflecting non-bonded portion 35 away from major bend axis 28, a serpentine fold is created in flexible film 18. The serpentine profile of non-bonded loop region 35 reduces the space required between upper surfaces 15a and 16a for the deflection of non-bonded portion 35 when base plate 12 is bent at a 90° angle about major bend axis 28.

Figure 4:
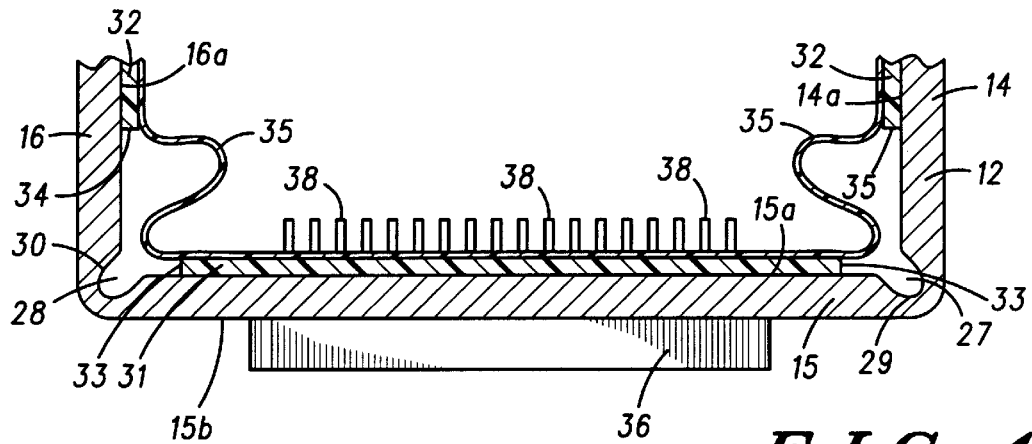
FIG. 4 is a cross-sectional view of a portion of the subassembly illustrated in FIG. 1 after attachment of an electrical connector.

The advantages of creating a serpentine profile and deflecting non-bonded portion 35 of flexible film 18 away from the major bend axis is illustrated in the partial cross-section shown in FIG. 4. When base plate 12 is bent about first and second major bend axis 27 and 28, non-bonded portions 35 deflect along first and third sections 14 and 16 and form a serpentine pattern in the gap between first and second adhesive films 31 and 32. The deflection of flexible film 18 into serpentine patterns at the major bend axis permits first section 14 and third section 16 of base plate 12 to be brought into close proximity with each other.

Those skilled in the art will appreciate that a simple parabolic deflection of non-bonded portions 35 into the space between first and third sections 14 and 16 would require that second section 15 of base plate 12 have extra width. This would be necessary to avoid the possibility of metal traces overlying the non-bonded portions of the flexible film from contacting one another and creating electrical shorts. Furthermore, the serpentine deflection pattern of non-bonded portions 35 avoids the possibility of friction damage to the flexible film from rubbing against the base plate when the plate is bent.

An electrical connector 36 housing electrical contact pins 38 is mounted to second section 15 of base plate 12. Electrical contact pins 38 are inserted through through-holes 24 and make electrical contact to terminations 22 and 23 on the surface of flexible film 18. First adhesive film 31 secures flexible film 18 to second section 15 permitting solid electrical contact between electrical contact pins 38 and terminations 22 and 23. Thus, the precise placement of first and second adhesive films 31 and 32 on upper surfaces 14a, 15a, and 16a performs two important functions. First, as previously described, the asymmetric placement about the major bend axis beneficially causes the non-bonded portions of flexible film 18 to deflect into serpentine configurations, and second, the bonding secures a portion of flexible film 18 to base plate 12 for the attachment of an electrical connector at second section 15.

It is important to note that the placement of first and second grooves 29 and 30 at upper surface 15a results in a substantially 90° bend angle about first and second major bend axis 27 and 28. Although the grooves are depicted as rounded features, other geometric forms are possible. For example, different geometric shapes for first and second grooves 29 and 30 are possible. For example, the grooves can be machined to have a "V" shape, or a "U" shape, or the like.

As will subsequently be described, the creation of substantially 90° bend angles at first and second major bend axis 27 and 28 results in a lower profile height of an electronic control module assembled in accordance with the invention. Additionally, the sharp bend profile created by grooves 29 and 30 preserves a relatively high degree of flatness in lower surface 15b after base plate 12 is bent. By not causing lower surface 15b to bulge out near the bend axis, electrical connector 36 can be tightly mated to section 15 of base plate 12. The close alignment of lower surface 15b with electrical connector 36 insures that a good seal can be made around the edges of the electrical connector.

An exploded assembly view of an electronic control module 40 arranged in accordance with one embodiment of the invention is illustrated in FIG. 5. The assembly view illustrates the arrangement of base plate 12, flexible film 18, electrical connector 36, and an enclosure housing 42. In an assembly process, flexible circuit 18 is bonded to base plate 12 and metal traces 20 and 21 are defined on flexible film 18. Once the traces are defined, flexible film 18 is populated with electrical devices 26. Then, base plate 12 is bent around enclosure housing 42, and electrical connector 36 is inserted through apertures 44 in second section 15 of base plate 12. In addition, second section 15 of base plate 12 includes apertures 46 that receive locating pins 48 for the alignment of electrical connector 36 to base plate 12.

Enclosure housing 42 includes a pair of arms 46 and 47 that are joined at one end by a laterally extending arm 48. A support arm 49 extends between arms 46 and 47 and supports mandrels 50 spaced apart at predetermined distances along support arm 49. A brace plate 51 laterally extends between arms 46 and 47, extending arm 48, and support arm 49. Mandrels 50 extend through openings 53 in flexible film 18 and press against second section 15 of base plate 12 at the time the base plate is bent about enclosure housing 48. Each of the arms 46 and 47 may carry a mounting foot 52, which can be used to mount electronic control module 40 to another structure.

Figure 6:
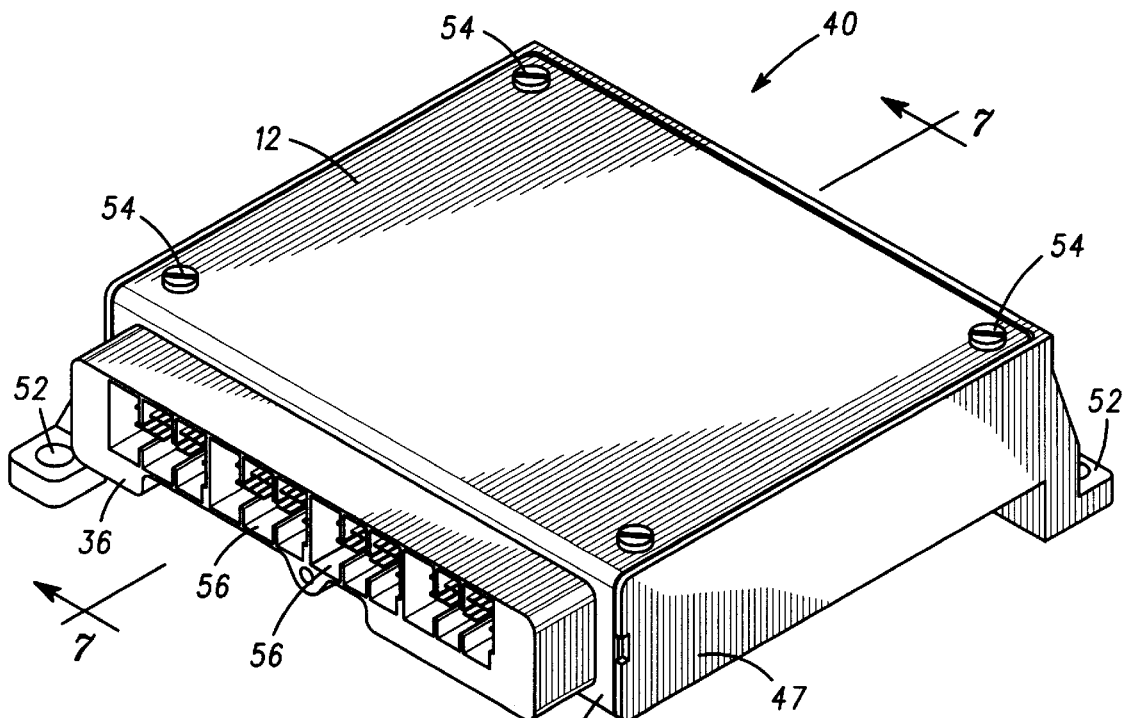
FIG. 6 is a perspective view of the electronic control module of FIG. 5 after a bending operation and assembly into its final configuration.

Sealant is placed around the periphery of base plate 12 prior to the bending operation in order to for a seal between base plate 12 and enclosure housing 42. The peripheral seal prevents dirt and debris from entering electronic control module 40. Once base plate 12 is bent around enclosure housing 48, the base plate is secured to enclosure housing 48 by attachment means 54, as shown in FIG. 6. Electrical connector 36 protrudes from second section 15 of base plate 12 and has connection ports 56 for receiving external electrical connections. It is important to note that the bonding of flexible film 18 to second section 15 permits electrical connector 36 to be attached to the backside of electronic control module 40. Further, the asymmetric arrangement of first and second adhesive films 31 and 32 about the major bend axis permits the overall height of electronic control module 40 to be minimized. By reducing the outside dimensions of electronic control module 40, the control module can be mounted in a small space within an automobile engine compartment.

Figure 7:
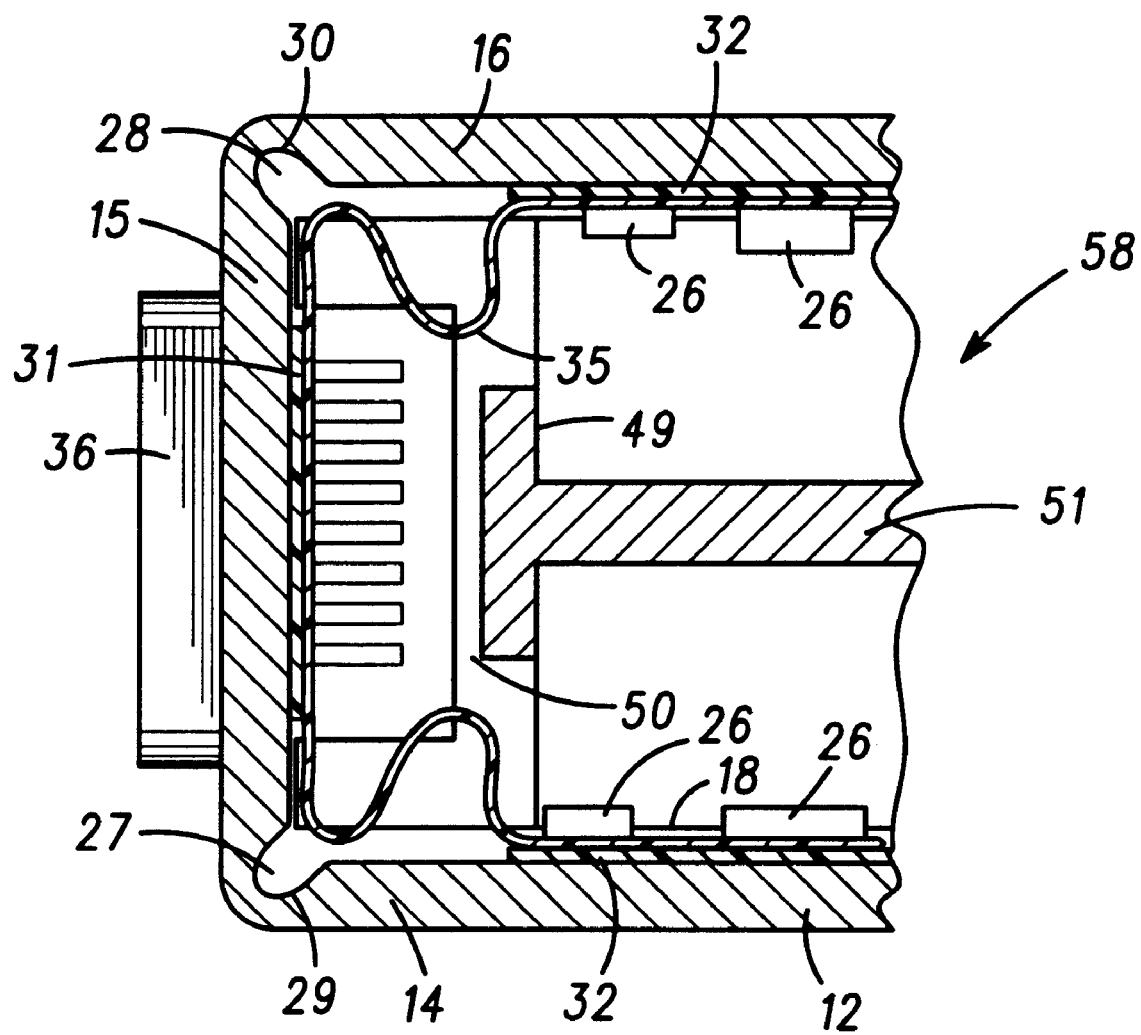
FIG. 7 is a cross-sectional view of a portion of the electronic control module as viewed along section lines 7—7 in FIG. 6.

A cross-section view taken along section line 7—7 of FIG. 6 is illustrated in FIG. 7. Mandrel 50 of contacts first, second and third sections 14, 15, and 16 of base plate 12 in proximity to first and second grooves 29 and 30. During the bending operation, the right-angle geometry of mandrel 50, together with grooves 29 and 30, permit base plate 12 to be bent around mandrel 50 and to form approximately 90° angles at the bend corners. It is important to note that the height of the mandrels 50 together with their positions along support arm 49 determine the bend quality at the major bend axis. The relatively sharp angles created in base plate 12 further reduces the overall size of electronic control module 40, and allows the module to be mounted in tight spaces within an automobile engine compartment.

Enclosure housing 42 cooperates with the deflection of flexible film 18 during the bending operation such that non-bonded portions 35 deflect away from support arm 49 and mandrels 50. As shown in FIG. 7, non-bonded portions 35 flex away from base plate 12 in a region of the cavity created by the bending operation located immediately away from support arm 49. Accordingly, the space within the interior cavity consumed by support arm 49, mandrels 50, and non-bonded portions 35 is minimized.

The geometric arrangement of enclosure housing 42, together with the serpentine bend pattern of flexible film 18, reduce the amount of space within the cavity 58 needed to accommodate the film deflection caused by the bending operation. Furthermore, the particular arrangement illustrated in FIG. 7 permits electrical devices 26 to be mounted on flexible film 18 to within about 4 mm of major bend axis 27 and 28. By placing electronic components very close to the major bend axis, the total surface area of flexible film 18 (and the volume of electronic control module 40) can be kept to a minimum value. Alternatively, for a given set of exterior dimensions, more complex functions can be performed by electronic control module 40 through adding more electronic components, such as electrical devices 26, to flexible film 18.

Those skilled in the art will appreciate that the asymmetrical bonding of a flexible film about a major bend axis can be advantageously employed in a variety of geometric configurations for the formation of a modular electronic assembly. For example, although first and third sections 14 and 16 of base plate 12 have been illustrated as forming substantially parallel surfaces after the bending operation, it is possible to construct an electronic assembly about a single major bend axis and form a wedge shaped protective housing. In the case of a single major bend axis, upon bending about the axis, the sides of the base plate diverge from one another. Also, the extent of bending about the major bend axis can range from less than 90° to greater than 90°. It will be appreciated by one of skill in the art that in the case of a single major bend axis, a mandrel having a geometry substantially different from that illustrated in the embodiment disclosed herein is required.

Thus it is apparent that there has been provided, in accordance with the invention, an electronic control module which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, the electronic control module can have different external geometry, such a rectangular, square, pie shaped, and the like. It is therefore intended to include within the invention all such variations and modifications as fall within the scope of the appended claims and equivalents thereof.

We claim:

1. An electronic control module comprising:

a base plate having opposing first and second planar surfaces and a major bend axis extending across the base plate;

a flexible film overlying the first planar surface of the base plate and having first and second portions bonded thereto;

a first adhesive layer intermediate to the flexible film and the base plate and bonding the first portion of the flexible film to the first planar surface of the base plate, wherein the first adhesive layer has an edge proximate to the major bend axis located a first distance from the major bend axis; and a second adhesive layer intermediate to the flexible film and the base plate bonding the second portion of the flexible film to the first planar surface of the base plate, wherein the second adhesive layer has an edge proximate to the major bend axis located a second distance from the major bend axis, and wherein a non-bonded portion of the flexible film spans the first and second distances, and wherein the first distance is substantially unequal to the second distance.

2. The electronic control module of claim 1, wherein the first and second adhesive layers comprise a pressure sensitive adhesive, and wherein the flexible film comprises a flexible polyimide material.

3. The electronic control module of claim 1, wherein the base plate is bent over on itself by approximately 180° along the major bend axis, and wherein the non-bonded loop portion is laterally shifted away from the major bend axis toward one of the first and second sections of the flexible film.

4. An electronic control module of claim 1, further comprising:

a groove in the first planar surface coextensive with the major bend axis; and wherein the non-bonded bracket portion of the flexible film spans the groove.

5. An electronic control module comprising:

a base plate having opposing first and second planar surfaces and having first and second major bend axes extending widthwise across the base plate, wherein the first and second major bend axes are separated by a central section of the base plate;

an insulating film overlying the first planar surface of the base plate and having first, second, and third portions bonded thereto;

a first adhesive layer bonding the first portion of the insulating film to the first planar surface, wherein the first adhesive layer has first and second edges located a first distance from the first major bend axis and the second major bend axis, respectively;

a first region of the second adhesive layer bonding the second portion of the insulating film to the first planar surface, wherein the first region of the second adhesive layer has an edge located a second distance from the first major bend axis; and a second region of the second adhesive layer bonding the third portion of the insulating film to the first planar surface, wherein the second region of the second adhesive layer has a first edge located at a third distance from the second major bend axis, and wherein the first and second distances are substantially unequal.

6. The electronic control module of claim 5 further comprising:

a plurality of conductors carried by the insulating film and having terminations located in proximity to the central section; and a connector inserted through an opening in the central section and coupled to the terminations for electrically connecting the plurality of conductors to external devices.

7. The electronic control module of claim 5 further comprising:

first and second grooves in the first planar surface and coextensive with the first and second major bend axes, respectively; and portions of the insulating film spanning the first and second grooves.

8. An electronic control module comprising:

a base plate having a first major bend axis extending across the base plate, wherein the base plate is bent over on itself along the first major bend axis to provide a cavity at least partially enclosed by first and second interior surfaces;

a flexible insulating film overlying the first and second interior surfaces and bonded thereto; and an adhesive layer intermediate to the base plate and the flexible insulating film and having a gap therein, wherein the gap is asymmetrically centered about the first major bend axis, and wherein a non-bonded loop portion of the flexible insulating film spans the gap and is displaced away from the first major bend axis along one of the first and second interior surfaces.

9. The electronic control module of claim 8, wherein the first and second interior surfaces are substantially parallel.

10. The electronic control module of claim 8 further comprising:

a second major bend axis;

a back section of the base plate intermediate to the first and second major bend axes; and a portion of the flexible insulating film bonded to the back section.

11. The electronic control module of claim 10 further comprising:

a plurality of conductors carried by the flexible insulating film and having terminations located in proximity to the back section; and a connector inserted through an opening in the back section and coupled to the terminations for electrically connecting the plurality of conductors to external devices.

12. An electronic control module comprising:

a base plate having first and second major bend axes along which the base plate is bent in a "U" shape to provide an inner surface, the inner surface having first and second elongated sections separated by a back section; and a flexible circuit-carrying film bonded to a substantial area of the inner surface and having non-bonded loop portions displaced away from the first and second major bend axes along the first and second elongated sections, wherein, the non-bonded loop portions are asymmetrically displaced from the first and second major bend axes.

* * * * *